United States Patent [19]

Kirschner

[11] 4,023,160
[45] May 10, 1977

[54] ANALOG TO DIGITAL CONVERTER

[75] Inventor: Barry Alex Kirschner, Flemington, N.J.

[73] Assignee: RCA Corporation, New York, N.Y.

[22] Filed: Oct. 16, 1975

[21] Appl. No.: 622,867

[52] U.S. Cl. .................. 340/347 NT; 340/347 AD
[51] Int. Cl.² ..................................... H03K 13/20
[58] Field of Search ............. 340/347 NT, 347 AD

[56] References Cited

UNITED STATES PATENTS

| | | | |
|---|---|---|---|
| 3,504,267 | 3/1970 | James | 340/347 NT |
| 3,564,538 | 2/1971 | Bondzeit | 340/347 NT |
| 3,566,397 | 2/1971 | Walton | 340/347 NT |
| 3,703,001 | 11/1972 | Hibbs | 340/347 NT |
| 3,733,600 | 5/1973 | Hellwarth | 340/347 NT |
| 3,765,012 | 10/1973 | Grutzediek | 340/347 NT |
| 3,772,683 | 11/1973 | Dorey | 340/347 NT |
| 3,833,902 | 9/1974 | Eto | 340/347 NT |
| 3,913,096 | 10/1975 | Veszi | 340/347 NT |

*Primary Examiner*—Charles D. Miller
*Attorney, Agent, or Firm*—Edward J. Norton; H. Christoffersen; William Squire

[57] ABSTRACT

An analog to digital converter includes a plurality of current sources selectively coupled to a capacitor for charging the capacitor from a reference level with a first reference current in a fixed time period and for discharging the capacitor with a second reference current to the reference level. The capacitor is then charged from the same reference level with a current derived from an unknown voltage source for the same period of time as in the case of the first reference current and discharged to that reference level at the same discharge rate by discharging with the second reference current. The difference between the respective times it takes the capacitor to discharge to the reference level in the two discharge cycles is determined and represents the amplitude of the unknown voltage. Suitable display means provide a digital representation of this amplitude. All the active digital and linear components can be formed on a single semiconductor chip using both PMOS and NMOS enhancement mode transistors in microcircuit form.

18 Claims, 3 Drawing Figures

4,023,160

1

ANALOG TO DIGITAL CONVERTER

FIELD OF INVENTION

This invention relates to a system for converting an analog input signal into a digital representation of the magnitude of that input signal.

BACKGROUND OF THE INVENTION

One widely used analog to digital converter (ADC) utilizes what is known as a dual slope technique. In this technique, an operational amplifier utilizing bipolar transistors having a capacitor connected in a feedback path integrates an input signal. An input signal in the form of a standardized reference current is fed to a current summing junction through an analog gate. The standardized reference current is of opposite polarity to an analog input current which input current is applied to the current summing junction. The combined analog input current and the gated standardized reference current at the current summing junction is applied to the input of the integrator. The integrated output is applied to the analog gate through suitable circuit means to actuate the gate to a closed condition at a predetermined level of the output from the integrator. A time based oscillator is connected to the analog gate for actuation of the gate to an open condition at predetermined time intervals. The ratio of the time during which the analog gate is open to the time of the complete operating cycle during which the gate is both opened and closed is a measure of the analog input current to the converter. In essence, a time ratio function is developed expressly for the analog input. The time ratio function is then applied to switch a time based oscillator scaled to provide a digital output. The digital output represents the amplitude of the analog signal.

Many forms of this so-called dual slope ADC have been developed over the past few years. However, each of the systems have required mainly an integrator of the Miller or similar type utilizing an operational amplifier and capacitor in the feedback loop. This type of integrator conventionally utilizes linear active devices such as bipolar transistors. However, the timing function including means for providing the clock signals and for providing the digital output from the converter may be digital devices. As a result, the usual configuration for the present state of the art ACD's are two so-called "chips", wherein one chip packages the bipolar linear devices and the other chip packages the digital components. This system is both costly and complicated to fabricate in that the interconnection of two separate chips is required.

SUMMARY OF THE INVENTION

An analog to digital converter includes first current mirror means for producing a first signal having a magnitude proportional to a reference potential. Second current mirror means provide a second signal having a magnitude proportional to an unknown potential. Means are provided for comparing the magnitudes of the first and second signals to produce as an output therefrom a digital signal representing the magnitude of the unknown potential. The respective means comprise microcircuit CMOS devices constructed on a single microcircuit semiconductor wafer, the devices including linear and digital active elements formed solely of metal oxide semiconductors.

In one aspect, the analog to digital converter comprises means for selectively applying a first reference current in a first sense to a node and for selectively applying a second reference current in a second sense to the node. Further means are provided for selectively applying a third current in the first sense to the node wherein the third current is proportional to the level of a signal having a value to be determined. Charge storage means are coupled to the node. Circuit means are provided including comparator and counting means responsive to the value of the charge stored in the storage means for applying the first, second and third currents to the node in a predetermined sequence so that the storage means is (1) charged for a first time interval from an initial given reference charge value by the first current; (2) discharged to the given reference charge value in a second time interval by the second current; (3) charged from the reference charge value in a time interval whose duration is the same as the first time interval by the third current; and (4) discharged to the given reference charge value by the second current in a third time interval, the period of the third time interval with respect to the period of the second time interval manifesting the signal value to be determined.

In the drawings

DETAILED DESCRIPTION

Figure 1:
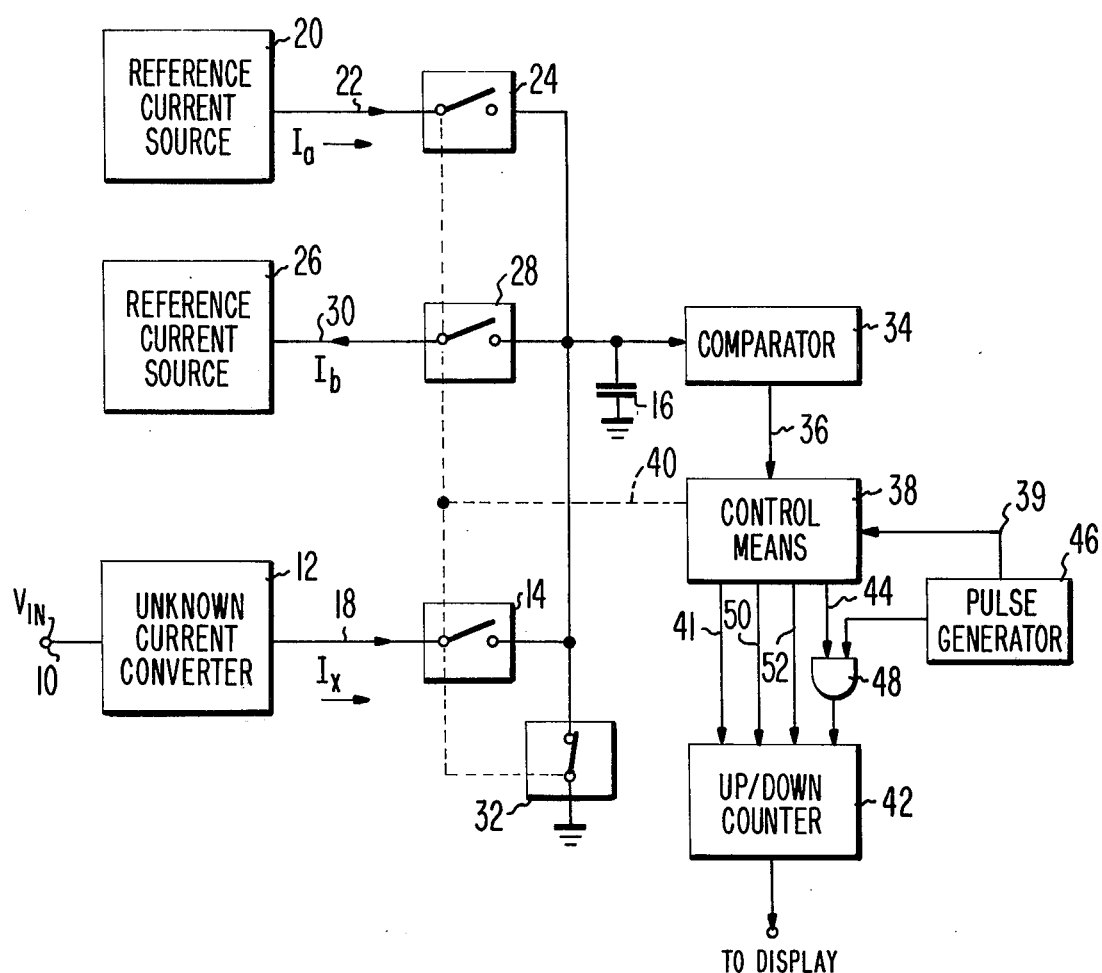
FIG. 1 is a diagrammatic schematic of an analog to digital converter system constructed and operated in accordance with the present invention.

In FIG. 1, an analog voltage $V_{IN}$ to be converted is applied to input terminal 10 which is connected to a current converter 12. Converter 12 converts the voltage applied at terminal 10 into a current $I_x$, the magnitude of which is proportional to the magnitude of the analog voltage $V_{IN}$ to be determined. The current $I_x$ from converter 12 is applied in the direction of arrow 18 through a switch 14 to charge a capacitor 16 in a first sense when switch 14 is closed. A reference current $I_a$ is provided by reference current source 20 in the direction of arrow 22 through a switch 24 to charge capacitor 16 in the first sense when switch 24 is closed. Current $I_a$ is preferably provided from a constant current source. A second reference current source 26, which is also preferably a constant current source applies a second reference current $I_b$ through switch 28 to capacitor 16. Current $I_b$ has a sense in the direction of arrow 30 opposite the first sense of arrow 22 directed to withdraw current from capacitor 16 when switch 28 is closed. A fourth switch 32 is connected to a source of reference potential $V_{gnd}$ such as ground (the lowest potential in the circuit) via the junction of capacitor 16 and switches 24, 28 and 14 in a manner to alter the charge on capacitor 16 to a value less than a reference potential level $V_{TR}$. Preferably currents $I_a$ and $I_b$ are substantially the same to charge and discharge capacitor 16 at about the same rates. However, this is not essential to the accurate operation of the converter and constructed in accordance with the present invention.

Capacitor 16 is also connected to a voltage or charge comparator 34 at the junction of switches 14, 24 and 28. Comparator 34 can be of the type that provides a binary signal at an output lead 36 having one of two values. When the charge on capacitor 16 is less than a reference level $V_{TR}$, the signal on output lead 36 represents one binary value, e.g. zero. When the charge on capacitor 16 exceeds reference level $V_{TR}$, the signal on the output lead 36 represents a second binary value, e.g., one. Comparator 34 is a suitable threshold detector which preferably comprises a series of serially connected inverters as will be described in more detail in connection with FIG. 2.

In response to the value of the binary signal present on lead 36, a control means 38 provides a plurality of control signals on switch control lead 40 (dotted) and output leads 41, 44, 50 and 52. Lead 40 represents a plurality of leads coupled to switches 14, 24, 28 and 32 for placing each of these switches in either the open or closed switch position. In practice switches 14, 24, 28 and 32 can be transmission gates of the type described in more detail below. As provided in accordance with the present invention, the switches 24, 28, 14 and 32 are opened and closed in a predetermined time sequence and at time intervals in a manner to be explained. The signals on leads 41, 44, 50 and 52 are suitable control signals for operating up/down counter 42. Pulse generator 46 provides timing pulses to control means 38 via lead 39 and to counter 42 via AND gate 48. Up/down counter 42 provides a count for each conversion cycle which represents the magnitude of voltage $V_{IN}$. This count is applied to a suitable display which displays in digital form the value of voltage $V_{IN}$.

In explaining the operation of the ADC of FIG. 1, reference will be made to FIG. 3. Initially in a period $t_d$ switch 32 is closed and switches 14, 24 and 28 are open. The state of these switches is given by curves $d$, $c$, $a$ and $b$, respectively, where a high value shows a closed switch and a low value an open switch. The closing of switch 32 withdraws energy from capacitor 16 to a value below the reference voltage level $V_{TR}$, see FIG. 3, curve $m$. Preferably the potential of capacitor 16 at this time is at ground $V_{gnd}$. Suitable timing means in control means 38 opens switch 32 after a short time period and closes switch 24, switches 28 and 14 remaining open. At this time, a current $I_a$ from source 20 is applied through switch 24 to charge capacitor 16. The charge on capacitor 16 increases until the potential level $V_{TR}$ is sensed by comparator 34. At this time, the value of the binary signal present on comparator 34 output lead 36 switches from a first binary state, e.g. low, to a second binary state, e.g. high. In response to this second binary state, e.g. high, control means 38 generates an internal timing signal representing a fixed predetermined time interval $T_1$. See FIG. 3, curve $m$. Capacitor 16 is charged for the duration of time interval $T_1$ by the current from source 20 at a rate determined by the current $I_a$. This produces an up-ramp for the charging of the capacitor 16 as illustrated by slope S1, curve $m$, FIG. 3.

At the end of the time interval $T_1$, control means 38 in response to the above-noted internally generated timing signal opens switch 24 and closes switch 28, the other switches remaining in the open position by way of a switch control signal on lead 40. This commences the time period $t_1$. The current $I_b$ from reference current source 26 has a sense 30 which discharges the capacitor 16 through closed switch 28. The capacitor 16 at this time discharges characterized by a downward ramp as shown by slope S2, curve $m$, FIG. 3. During period $T_1$, the control means 38 generates a toggle enable signal on output lead 50 which enables the counter 42 in a well known manner just prior to the start of period $t_1$. Prior to the time slope S2 commences during period $T_1$, control means 38 generates a signal on lead 41 which thereafter causes up-down counter 42 to count down, FIG. 3, curve $n$. At time $t_1$, a clock enabling signal is applied at output lead 44 which enables AND gate 48 to pass clock pulses from generator 46 through AND gate 48 to the clock input of counter 42. Counter 42 at the start of interval $t_1$ counts down the clock pulses supplied by generator 46. When the potential in capacitor 16 decreases to the reference level $V_{TR}$ intercepted by slope S2 as shown in FIG. 3, the output signal on lead 36 switches binary states from high to low causing control means 38 to send a clock disable signal on output lead 44 disabling gate 48. Counter 42 at this time registers a count which is a measure of the time interval $t_1$. This measure is the same as for the period $T_1$, since the reference currents $I_a$ and $I_b$ in this example are the same. It can be shown that the time interval $t_1$ is proportional to the magnitude of the current $I_a$ from current source 20 applied to the capacitor 16 for the time period $T_1$.

Figure 3:
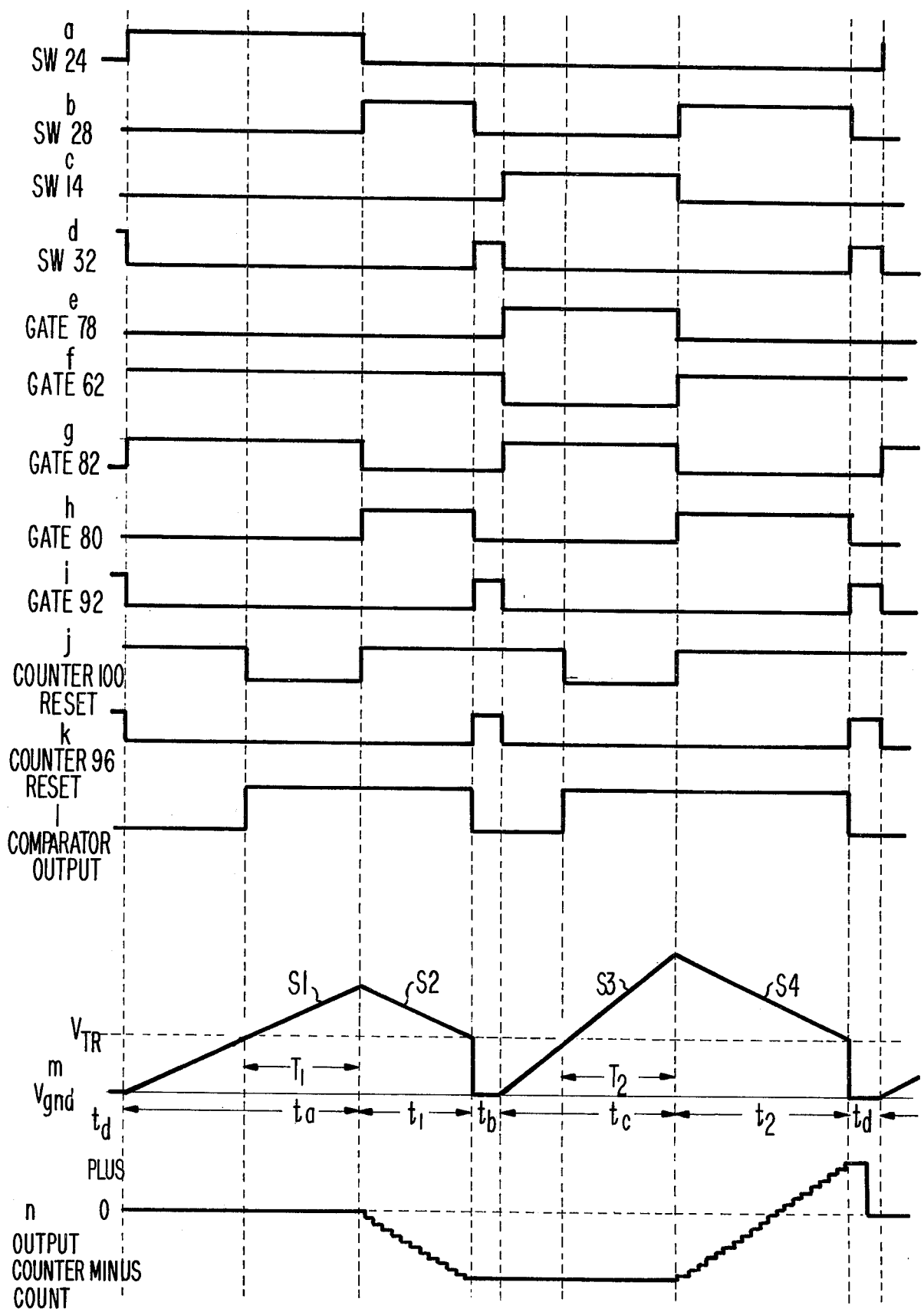
FIG. 3 shows various curves useful in explaining the operation of the converter of FIGS. 1 and 2.

At the end of interval $t_1$, control means 38, in response to the switching of the binary signal from high to low on comparator 34 output lead 36, generates a switch control signal on lead 40 which opens switch 28 and closes switch 32 for a short period $t_b$, see curves $d$ and $m$, FIG. 3. Closing switch 32 withdraws the remaining stored energy from capacitor 16 and reduces the potential in capacitor 16 to ground $V_{gnd}$. This state is maintained for a few clock pulses to ensure that the capacitor is at $V_{gnd}$. Control means 38 by way of an internally generated timing signal then closes switch 14 and opens switch 32. At this time only switch 14 of the four switches is closed. See curve $c$, FIG. 3. A voltage $V_{IN}$ of unknown magnitude to be determined applied to terminal 10 is converted by converter 12 into a suitable current $I_X$ proportional to $V_{IN}$ and having a sense in the direction of arrow 18 which charges the capacitor 16 during period $t_c$. While a current converter 12 and a separator source 20 are shown, it will be appreciated that the same unit may provide the currents $I_a$ and $I_X$ having separate inputs for a reference voltage and the unknown voltage to be converted. When the charge in the capacitor 16 reaches the reference level $V_{TR}$ at the start of period $T_2$, comparator 34 senses this level and switches the binary signal on output lead 36 from a low to a high state. The binary high signal on output lead 36 initiates the generation of a timing signal in means 38 which timing signal determines time interval $T_2$ the same in duration as time period $T_1$. Periods $T_1$ and $T_2$ define equal fixed periods which immediately follow the crossover of respective slopes S1 and S3 at level $V_{TR}$. At the end of time interval $T_2$ control means 38 opens switch 14, closes switch 28, curves $c$ and $b$, respectively, and applies a signal at output lead 44 enabling gate 48 to pass clock pulses to counter 42. A signal applied at output 41 of control means 38 at the beginning of period $T_2$ enables counter 42 to count up. During period $T_2$, just prior to the start of period $t_2$, a toggle enable signal is applied to lead 50 which enables the counter 42 to commence counting. The toggle enable signal is applied prior to the counting periods $t_1$ and $t_2$ to prevent false clock pulses clocking the counter 42. Period $t_2$ is determined by the time it takes the potential in capacitor 16 to decrease to level $V_{TR}$. It can be shown that period $t_2$ is proportional to the magnitude of the current from source 12 applied to capacitor 16 in period $T_2$. Further it can be shown that the interval $t_2$ is proportional to the time interval $t_1$ and this proportionality represents the difference in amplitudes of the currents applied from source 20 to capacitor 16 and from the converter 12 to capacitor 16 in the same intervals $T_1$ and $T_2$ (see appendix). It is essential that the currents applied to capacitor 16 during periods $t_1$ and $t_2$ be the same.

Comparator 34, in response to the charge in capacitor 16 decreasing through the transfer level $V_{TR}$, generates a low signal on lead 36. This signal causes control means 38 to close switch 32, open switch 28 and disable counter 42 via signals on respective output leads 40 and 44 stopping the flow of pulses to counter 42. The up/down counter 42 now registers a count which represents the difference in counts occurring in time periods $t_1$ and $t_2$. This difference is proportional to the amplitude of the unknown voltage $V_{IN}$ applied to terminal 10 (see appendix). Suitable display means are coupled to the counter 42 for digitally displaying the count registered by counter 42 at this time. As will be shown in connection with FIG. 2, except for capacitor 16 and a few resistors, all of the circuit elements of FIG. 1 can be provided by MOS devices on a single semiconductor chip wherein both linear and digital elements are all of similar construction.

At the end of the conversion cycle at the end of period $t_2$ and the start of the next period $t_d$, a signal is generated by control means 38 at output lead 52 for resetting up-down counter 42 to a zero digital count. Just prior to this time the potential on the capacitor 16 is reduced to ground level $V_{gnd}$ by the action of switch 32. The conversion cycle as described above is then repeated.

The particular advantage of the ADC of the present invention is that both the linear devices forming the sources 12, 20 and 26, switches 14, 24, 28 and 32 and comparator 34, and the digital devices comprising control means 38, generator 46, counter 42 and AND gate 48 may all be formed with CMOS devices. This provides a simpler and more economical construction than heretofore possible.

Figure 2:
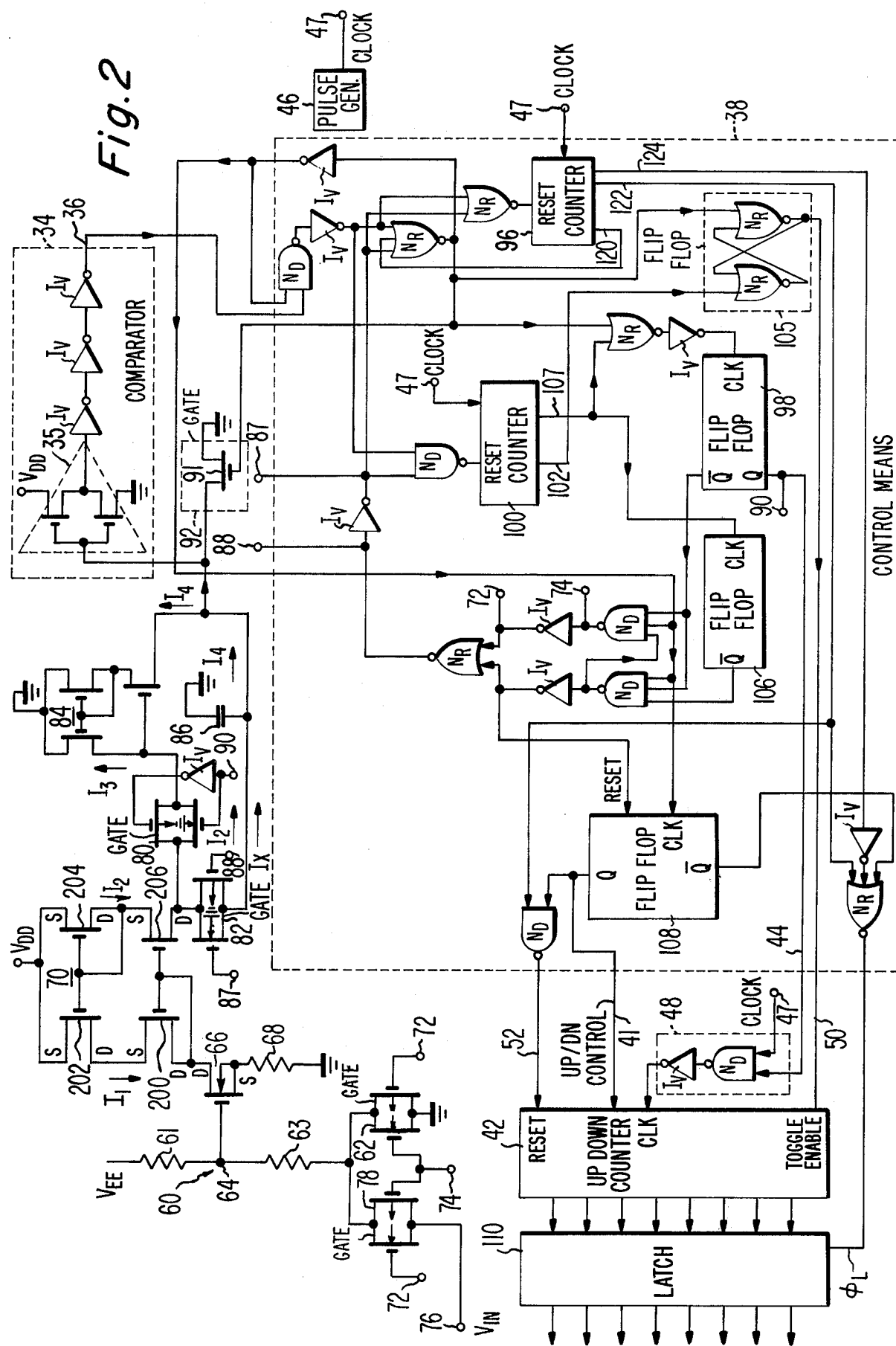
FIG. 2 is a detailed schematic representation of a preferred embodiment of the system of FIG. 1.

FIG. 2 illustrates one way of implementing the ADC of FIG. 1. In FIG. 2, a reference voltage $V_{EE}$ is applied to a voltage dividing network 60 comprising two resistors 61 and 63 serially connected through COSMOS transmission gate 62 to ground potential. Node 64 between resistors 61 and 63 is connected to the gate of source follower MOS transistor 66 connected to ground potential through source resistor 68. Source follower transistor 66 is one wherein its impedance in the saturation region is much less than the value of the resistance of resistor 68. A source of analog voltage $V_{IN}$ is applied to a terminal 76 which is connected to node 64 through COSMOS transmission gate 78 and resistor 63. Gates 62 and 78 are COSMOS devices each having a common control terminal 74 and a second common control terminal 72. A high or binary one at terminal 74 and a low or binary zero at terminal 72 opens gate 78 and closes gate 62. A high at terminal 72 and a low at terminal 74 closes gate 78 and opens gate 62.

A source of positive potential $V_{DD}$ is coupled to ground through source follower transistor 66 and resistor 68 through one side of a current mirror circuit 70 and to transmission gates 80 and 82 on the other side of current mirror circuit 70. Transmission gates 80 and 82 are also COSMOS devices. Circuit 70 comprises four P-type MOS transistors 200, 202, 204 and 206 connected in a current mirror arrangement.

The source of potential voltage $V_{DD}$ is connected to the source electrode of transistor 202. The drain electrode of transistor 202 is connected to the source electrode of transistor 200. The drain electrode of transistor 200 is connected to the drain electrode of transistor 66. The source of potential voltage $V_{DD}$ is serially connected first through the respective source and then drain electrodes of transistors 204 and 206 to gates 80 and 82. The gate electrodes of transistors 200 and 206 are connected to the drain electrode of transistor 200. The gate electrodes of transistors 202 and 204 are connected to the junction of the drain electrode of transistor 204 and the source electrode of transistor 206. When transistor 66 is conducting, a current $I_1$ flows through source follower transistor 66 and resistor 68 to ground while a second mirror current $I_2$ flows in a mirroring direction to gates 80 and 82. Voltage dividing network 60 and circuit 70 form a constant current generator. It can be shown that the magnitudes of currents $I_1$ and $I_2$ are the same. Current $I_2$ is maintained at a constant value by the feedback action present in circuit 70.

Circuit 70 operates as follows. Current $I_1$ is established by the voltage at transistor 66 source divided by the value of resistor 68. To provide a given current $I_1$, a gate to source voltage $V_{GS}$ and drain to source voltage $V_{DS}$ need be present at transistors 200 and 202. Since the gate of transistor 202 is tied to the gate of transistor 204 and the sources of transistors 202 and 204 are at the same potential, it follows that the voltage $V_{GS}$ of transistor 204 must be equal to the voltage $V_{GS}$ of transistor 202. Transistor 204 is saturated by virtue of its gate being tied to its drain. Therefore, current in the transistor 204 source to drain electrode is effectively independent of transistor 204 drain to source voltage, and thus a function of only its gate to source voltage. Since the gate to source voltages of transistors 202 and 204 are equal, it follows that current $I_2$ equals current $I_1$ providing the mirror action. Transistor 206 must have drain to source and gate to source voltages corresponding to current $I_2$. Also, transistor 200 must have drain to source and gate to source voltages corresponding to current $I_1$. It is desirable to keep current $I_2$ constant.

If the voltage at the drain of transistor 206 rises, thereby decreasing the drain to source voltage of transistor 206, then the current $I_2$ has a tendency to decrease. This current $I_2$ must flow through transistor 204 drain to source electrodes since they are serially connected to transistor 206. The lower current in transistor 204 must be a result of a lower drain to source voltage in transistor 204. Since the transistor 204 gate is tied to the transistor 204 drain, the gate to source voltage of transistor 204 must also be lower. Since the transistor 204 gate is tied to the gate of transistor 202, then the gate to source voltage of transistor 202 must also decrease. A lower gate to source voltage on transistor 202 has a tendency to decrease current $I_1$, but current $I_1$ is maintained by the constant source voltage of transistor 66 divided by the value of resistor 68. The voltage at the source of transistor 66 is constant because it is determined solely by the gate voltage of transistor 66 which is determined by the known or unknown voltage. Therefore, to maintain current $I_1$ through transistor 202 which has a reduced gate to source voltage, its drain to source voltage must increase. Since the drain to source voltage of transistor 202 increases, the drain to source voltage of transistor 200 decreases. To maintain the current $I_1$ constant in transistor 200, the drain to source voltage must increase. If the drain to source voltage increases at transistor 200, the drain potential of transistor 200 with respect to the potential at source voltage $V_{DD}$ increases. This decreases the potential at the gate of transistor 206 which increases the gate to source voltage of transistor 206. An increasing gate to source voltage causes an increasing current which counters the originally decreasing current caused by the decreasing drain to source voltage of transistor 206.

It is essential that the characteristics of transistors 200, 202, 204 and 206 be matched to provide good mirror action, i.e., to ensure that current $I_1$ matches current $I_2$. Currents $I_1$ and $I_2$ are a function of the gate to source and drain to source voltages. Since the change in voltages at the drain of transistor 206 is distributed over two transistors 204 and 206, for best mirroring action these same voltage changes are also distributed over two transistors on the other side of the mirror to balance the combined impedance of the serially connected transistors on each side of the mirror.

Thus, a pair of serially connected transistors are provided on each side of the mirror to provide a balance of impedances on each side of the mirror and negative feedback to provide a constant current. The constant current is provided for a plurality of different voltages which may be coupled to node 64, e.g., voltages $V_{EE}$ and $V_{IN}$, noting $V_{IN}$ may be any unknown value. It will be appreciated that the circuit 70 provides a constant current $I_2$ for the reference voltage $V_{EE}$ when gate 62 is closed and gate 78 is open and a constant current $I_X$ for the analog voltage $V_{IN}$ to be measured when gate 78 is closed and gate 62 is opened. In the first instance current $I_2$ represents a reference current while in the latter instance current $I_X$ represents a current proportional to the amplitude of $V_{IN}$ applied to terminal 76.

A second current mirror circuit 84 is coupled between ground potential and transmission gate 80 on one side of circuit 84 and capacitor 86 on the other side of circuit 84. Circuit 84 comprises three N-type MOS transistors coupled in a current mirror feedback arrangement. When gate 80 is closed and gate 82 is opened, current $I_2$ flows through transmission gate 80 causing a current $I_3$ to flow on one side of circuit 84 to ground. A mirror current $I_4$ is caused to flow to ground on the other side of circuit 84 by the current mirror feedback arrangement in circuit 84. Current $I_4$ ideally should be the same magnitude as current $I_2$ but in practice may differ in value. Noting that the current $I_4$ is substantially the same at all times while current $I_X$ will have different values, circuit 84 need not include a transistor similar in impedance balancing function as transistor 200 of circuit 70. Gate 82 has a pair of terminals 87 and 88. Gate 80 has a terminal 90 which is coupled directly to one side of gate 80 and to the other side of gate 80 through an inverter. A binary one or high at terminal 87 and a binary zero or low at terminal 88 closes gate 82 and in the converse a binary zero or low at terminal 87 and a high at terminal 88 opens gate 82. A low at terminal 90 opens gate 80 and a high at terminal 90 closes gate 80. In FIG. 3, curves $e$, $f$, $g$ and $h$, respectively, show the open and closed conditions of gates 78, 62, 82, and 80 wherein a low value indicates the gate is open and a high value indicates the gate is closed. To accomplish the gate operation appropriate gate control signals are provided by control means 38 at corresponding terminals labeled with the same designation. Gate 82, when closed, couples the current $I_2$ to the capacitor 86, and gate 80, when closed, couples current $I_4$ to capacitor 86.

In FIG. 2, reference current $I_2$ is selectively applied to the capacitor 86 during period $t_a$, charging the capacitor forming slope S1, curve $m$, FIG. 3. In this state, gate 78 is open, gate 62 is closed, gate 82 is closed and gate 80 is open. In period $t_1$ immediately following period $t_a$, gate 82 is opened and gate 80 is closed generating current $I_4$ and forming slope S2. Circuits 70 and 84 cooperate to generate constant current $I_4$ in period $t_1$ between capacitor 86 and ground potential for withdrawing the energy stored in capacitor 86 at a constant rate.

During the period $t_b$ immediately following period $t_1$, gate 80 is opened by a high signal, curve $h$, FIG. 3, and MOS transistor 91 forming gate 92 is closed coupling the junction between capacitor 86 and gate 82 to ground discharging the capacitor to ground potential $V_{gnd}$. During period $t_c$ immediately following period $t_b$, gate 78 is closed, gate 62 is opened, gate 92 is opened, gate 82 is closed and gate 80 is opened. This action couples resistor 63 to terminal 76 and decouples resistor 63 from ground, thereby producing a current $I_X$ which is proportional to the magnitude of the analog voltage $V_{IN}$ applied to terminal 76. Current $I_X$ charges up capacitor 86 producing slope S3, period $t_c$. In period $T_2$ immediately following period $t_c$, gate 78 is opened, gate 62 is closed, gate 82 is opened and gate 80 is closed, gate 92 being open. Current $I_4$ again flows discharging capacitor 86 at a constant rate producing slope S4. The discharge rate during periods $t_1$ and $t_2$ is the same since the same effective current $I_4$ discharges capacitor 86 in both periods.

The junction of gate 82 with capacitor 86 is coupled to comparator 34. Comparator 34 comprises a plurality of preferably four, serially connected COSMOS inverters one of which is detailed as shown at 35. Comparator 34 detects the voltage amplitude at its input terminal and causes an output voltage to have either a binary one or binary zero level in accordance with the sensed input voltage level. Switching of the output levels, curve 1, FIG. 3, occurs when the voltage at the input to the comparator reaches the transfer point or reference voltage level $V_{TR}$. This transfer point remains fixed for a given inverter and thus the switching or comparison occurs at the same reference voltage level $V_{TR}$ at each occurrence. There are no offset voltage problems in this comparator as occurs in operational amplifier type comparators. The serial connection of a plurality of inverters, identified as $I_V$ in triangular form in FIG. 2, increases the gain of the comparator. That is, the output signal has a sharp transition when the input voltage reaches $V_{TR}$. Each stage increases in sensitivity due to the narrowing transfer range of the output of the next preceeding inverter stage. The output of comparator 34 is connected to a plurality of NAND gates labeled $N_D$ inverters $I_V$, NOR gates $N_R$, flip-flops and counters, all of which are well known logic elements forming control means 38. These logic elements produce in response to a clock input signal from generator 46 terminal 47, and the binary inputs from comparator 34 on lead 36, gate control and timing signals as represented by curves $e$ through $k$, FIG. 3.

Transmission gate control signals applied to terminals 72, 74, 87, 88, 90 and to the control terminal of gate 92 are derived from signals produced by comparator 34, and three stage counter 96 and a ten stage counter 100 at the tenth stage output lead 107 and the associated gates and flip-flops. Counter 100 determines the termination time of periods $T_1$ and $T_2$ and the start of periods $t_1$ and $t_2$ via a predetermined count signal at the tenth stage output lead 107. Counter 100 generates a signal representing these periods in response to clock pulses applied at the clock input from generator 46 and a reset signal, curve $j$, applied at the reset input. The reset signal is derived from the comparator 34 and counter 100 lead 107. Counter 100 counts the applied clock pulses to determine the length of fixed periods $T_1$ and $T_2$ starting with a signal derived from comparator 34 at the crossover of slopes S1 and S3 at level $V_{TR}$. The counter 100 output signal at lead 107 is used to derive a signal via flip-flop 98 to disable AND gate 48 for periods $T_1$ and $T_2$. This gate enabling signal permits clock pulses to be applied to counter 42 during periods $t_1$ and $t_2$. The ninth stage output lead 102 of counter 100 provides a toggle enable signal prior to the termination of periods $T_1$ and $T_2$ through set-reset flip-flop 105 to the toggle enable input of counter 42.

Three stage counter 96 provides a timing signal via lead 120 which determines the time duration of periods $t_b$ and $t_d$. This latter timing signal is provided in response to a reset signal, curve $k$, applied to counter 96. The signal, curve $k$, is derived from counter 96, comparator 34 and counter 100.

An up/down control signal on lead 41 from flip-flop 108 Q output is derived from the signals of lead 107 and the comparator 34 output lead 36. The signal on the Q output of flip-flop 108 has two values which alternate for each half conversion cycle. For example, a low binary value causes counter 42 to count down a high binary value causes counter 42 to count up.

The transmission gate control signals at terminals 72, 74, 87 and 88 are derived from flip-flop 106 $\overline{Q}$ output and flip-flop 98 $\overline{Q}$ output via a signal on counter 100 output lead 107 and a signal derived from comparator 34. The transmission gate control signal at terminal 90 is provided by the Q output of flip-flop 98 whose state is determined by counter 100 and comparator 34.

The up-down counter 42 is reset by a signal on lead 52 at the end of each conversion cycle two clock pulses after the end of period $t_2$. The reset signal on lead 52 is derived from output 122 of counter 96 and from the Q output of flip-flop 108. The flip-flop 108 clock input receives a signal derived from the comparator 34 and counter 96 output.

Latch 110 receives the output count of counter 42 at the end of each conversion cycle in response to a $\phi_L$ signal derived from counter 96 and flip-flop 108. The count in latch 110 is updated after each conversion cycle. Latch 110 holds the received digital output signals until the end of the next conversion cycle. Any suitable display means (not shown) convert the digital output signal in latch 110 into a suitable digital display representing the magnitude of the voltage $V_{IN}$ applied to terminal 76.

Appendix $$V_{CAP_1} = V_{TR} + \frac{I_{CHG_1} T}{C_{INT}} \qquad 1)$$

$$t_1 = \frac{(V_{CAP_1} - V_{TR}) C_{INT}}{I_{DISCH_1}} \qquad 2)$$

$$V_{CAP_2} = V_{TR} + \frac{I_{CHG_2} T}{C_{INT}} \qquad 3)$$

Appendix-continued $$t_2 = \frac{(V_{CAP_2} - V_{TR}) C_{INT}}{I_{DISCH_1}} \qquad 4)$$

From (2) and (4)

$$t_2 - t_1 = \frac{C_{INT} (V_{CAP_2} - V_{CAP_1})}{I_{DISCH_1}} \qquad 5)$$

substituting (1) and (3) for $(V_{CAP_1})$ and $(V_{CAP_2})$ $$t_2 - t_1 = \frac{C_{INT}}{I_{DISC_1}} \frac{T}{(C_{INT})} (I_{CHG_2} - I_{CHG_1}) \qquad 6)$$

Or $$t_2 - t_1 = \frac{T}{I_{DISCH_1}} (I_{CHG_2} - I_{CHG_1}) \qquad 7)$$

$$I_{CHG_1} = \left[\left(\frac{R_{63}}{R_{61} + R_{63}}\right) V_{EE} - V_{TH_X}\right] / R_{68} \qquad 8)$$

$$I_{CHG_2} = \left[\left(\frac{R_{63}}{R_{61} + R_{63}}\right) V_{EE} + \left(\frac{R_{61}}{R_{61} + R_{63}}\right) V_x - V_{TH_X}\right] / R_{68} \qquad 9)$$

And $$I_{CHG_2} - I_{CHG_1} = \left[\left(\frac{R_{61}}{R_{61} + R_{63}}\right) V_X\right] / R_{68} \qquad 10)$$

Therefore $$t_2 - t_1 = \frac{(T) (R_{61}) (V_x)}{(I_{DISCH_1}) (R_{61} + R_{63}) (R_{68})} \qquad 11)$$

Since the quantities T, $R_{61}$, $R_{63}$, $R_{68}$ and $I_{DISCH_1}$ are known and constant, then $$(t_2 - t_1) \alpha V_x \qquad (12)$$

Note that equation (11) is independent of the value of the capacitance of capacitor $(C_{INT})$ and also of the clock frequency (since the intervals T, $t_2$ and $t_1$ are all determined from the same clock).

where:
$t_1$ = Time it takes for capacitor to discharge to $V_{TR}$ from $V_{CAP_1}$.
$t_2$ = Time it takes for capacitor to discharge to $V_{TR}$ from $V_{CAP_2}$.
$V_X$ = The unknown input voltage $V_{IN}$ to be measured.
$V_{TH_X}$ = Threshold voltage of the source follower transistor 66.
$R_{61}$, $R_{63}$, $R_{68}$ are the respective values of resistors 61, 63 and 68 of FIG. 2.
$V_{CAP_1}$ = Capacitor voltage at the end of period $T_1$.
$V_{CAP_2}$ = Capacitor voltage at the end of period $T_2$.
T = $T_1$ and $T_2$ = Fixed time interval during which the capacitor is charged.
$C_{INT}$ = Integrating capacitor capacitance.
$V_{TR}$ = Transfer point voltage of the first comparator stage.
$I_{CHG_1}$ = Charging current during period $T_1$ developed with input at "ground" potential.
$I_{CHG_2}$ = Charging current during period $T_2$ with input at unknown voltage to be measured.
$I_{DISCH}$ = Rate at which capacitor discharges (capacitor input at ground).

What is claimed is:
1. An analog to digital converter comprising:

a node, first means for selectively applying a first reference current in a first sense to said node, second means for selectively applying a second reference current in a second sense to said node, third means for selectively applying a third current in said first stage to said node, said third current being proportional to a signal having a value to be determined, charge storage means coupled to said node, circuit means including comparator and counting means responsive to the value of the charge stored in said storage means for applying said first, second and third currents to said node in a predetermined sequence so that said storage means is: first, charged for a first time interval from an initial given reference charge value by said first current; second, discharged to said given reference charge value in a second time interval by said second current; third, charged from said reference charge value in a time interval whose duration is the same as said first time interval by said third current; and fourth, discharged to said given reference charge value by said second current in a third time interval, the value of said third time interval with respect to the value of said second time interval manifesting said value to be determined, said circuit means comparing said third and second time intervals to produce a digital signal representing said value to be determined.

2. The converter of claim 1, wherein said circuit means includes clock means for generating pulses of a given, equal pulse duration during said second and third time intervals and for applying said pulses to said counting means so that said counting means produces a signal manifesting the difference in duration of said second and third time intervals, which difference represents the magnitude of said signal value to be determined.

3. The converter of claim 1 wherein said circuit means includes means for causing said second time interval to be contiguous with and follow said first time interval and said third time interval to be contiguous with and follow said same time interval.

4. The converter of claim 1 wherein said first, second and third means includes means for respectively generating said first and second currents as constant currents.

5. The converter of claim 1 wherein said first means is a current source generator and said second means is a current sink generator, said first and third currents having a sense opposite said second sense.

6. An analog to digital converter comprising:

charge storage means, means for selectively applying a first reference current in a first sense to said storage means in a first time interval, the charge in said storage means at the end of said first time interval having a first value, means for selectively applying a second reference current in a second sense to said storage means for a second time interval determined by the time it takes the charge in said storage means to shift from said first value to a reference value, means for selectively applying a third current in said first sense to said storage means in a third time interval the same in duration as said first time interval, said third current being proportional to an analog signal having a value to be determined, the charge in said storage means at the end of said third interval having a second value, means for selectively applying said second reference current in said second sense to said storage means for a fourth time interval determined by the time it takes the charge in said storage means to change from said second value to said reference value, and interval comparing means including means for generating first and second signals respectively representing the periods of said second and fourth intervals and for comparing the first and second signals to produce as an output therefrom a digital representation of said compared signals.

7. The converter of claim 6 further including means for shifting the value of the charge in said storage means to a third value at the end of said second and fourth time intervals and prior to said first and third intervals.

8. In combination:

a source of a first reference current, a source of a second reference current, means responsive to an analog signal applied as an input thereto for generating a third current proportional to the amplitude of said analog signal, charge storage means, switch means for selectively coupling said first, second and third currents to said storage means, said first and third currents being applied to said storage means in a first sense and said second current being applied to said storage means in a second sense, comparison means coupled to said charge storage means for producing an output signal therefrom manifesting the magnitude of the charge in said storage means, control means responsive to said comparison means output signal for producing a switch means control signal for sequentially connecting initially said first and then said second current sources to said storage means and then initially said third current generating means and then said second current source to said storage means, the time interval during which said first and third current sources are connected being the same, the time intervals during which said second current source is connected being determined according to the magnitude of the charge in said storage means, said control means producing a timing signal representing the period of the respective time intervals during which said second current source is connected to said storage means, the difference between said second current time interval periods manifesting the amplitude of said analog signal, and interval comparing means responsive to said timing signal to produce a digital signal representing the amplitude of said analog signal.

9. The combination of claim 8 wherein said comparison means includes a threshold detector for providing a first signal when the charge in said storage means is greater than a reference charge value and a second signal when the charge is less than said reference value, said control means being responsive to said first and second signals for generating said switch means control signal.

10. The combination of claim 9 wherein said comparison means comprises a plurality of serially connected inverters.

11. The combination of claim 9 further including means responsive to said switch means control signal for reducing the charge in said storage means to a value less than said reference charge value.

12. The combination of claim 8 wherein said current sources and each said means include microcircuit linear and digital elements formed on a single semi-conductor wafer and comprising solely MOS devices.

13. The combination of claim 8 wherein said first reference current source includes a first current mirror amplifier means, said second reference current source includes a second current mirror amplifier means, said third current generating means includes terminal means for receiving said applied analog signal, said switch means including a first switch coupled between said terminal means and said first current mirror amplifier means, a second switch coupled between said first and second current mirror amplifier means and a third switch coupled between (i) the junction between said first current mirror amplifier means and said second switch and (ii) said charge storage means.

14. An analog to digital converter comprising:

first current mirror amplifier means for producing a first current having a magnitude proportional to a reference potential, second current mirror amplifier means for producing a second current having a magnitude proportional to a potential of unknown magnitude, and means for comparing the magnitudes of said first and second signals to produce as an output therefrom a digital signal representing the magnitude of said unknown potential, each said means comprising microcircuit MOS devices constructed on a single microcircuit semiconductor wafer, said devices including linear and digital active elements formed solely of metal oxide semiconductor.

15. The combination of claim 14 wherein said first current mirror amplifier means includes first and second current generating means for producing first and second reference currents, said second current mirror amplifier means including third current generating means for producing a current having a magnitude proportional to said unknown magnitude, said first current mirror amplifier means including means for comparing said first and second currents to produce said first signal representing the relative magnitude of said first and second currents, said second current mirror amplifier means including means for comparing said third and second currents to produce said second signal representing the relative magnitudes of said third and second currents.

16. An analog to digital converter comprising:

means for producing first and second reference currents, means for producing a third current the magnitude of which represents the magnitude of a signal to be measured, means for producing a first timing signal representing the time it takes said second current to reach an accumulated energy level by corresponding to the energy level of said first current accumulated in a given time interval, means for producing a second timing signal representing the time it takes said second current to reach an accumulated energy level corresponding to the accumulated energy level achieved by said third current in a time interval the same in duration as said given time interval, and means for producing a digital output signal representing the difference in duration between said first and second timing signals.

17. In combination:

reactance means for storing energy, a first charging circuit coupled to said reactance means for charging said reactance means with a first reference current for a given time interval, a second charging circuit coupled to said reactance means for charging said reactance means with a current proportional to an input signal to be measured for a time interval the same as said given time interval, means including a discharge circuit coupled to said reactance means for withdrawing energy at a substantially constant rate from said reactance means until a predetermined energy level in said reactance means is reached, means including timing means for coupling said discharge circuit means to said reactance means following said given and said same time intervals, and digital signal generating means coupled to said discharge circuit for producing a digital signal representing the difference in durations of the time intervals for withdrawing said energy from said reactance means.

18. A method employing a charge storage device for determining the value of an analog current level $I_x$ comprising the steps of:

applying to said storage device a charging current of known value for a time interval $t_a$ after the voltage across said device is at a first level, whereby during said interval said voltage across said storage device changes to a second voltage level;

measuring the time $t_1$ required for the voltage across the storage device to change from the second back to the first level when discharged at a known rate $I_D$;

supplying said analog current $I_x$ to said storage device as a charging current for said interval $t_a$ measured from the time the voltage across it is at said first level, whereby the voltage across said device attains a level $V_x$;

measuring the time $t_2$ required for the voltage across said storage device to change from said level $V_x$ to said first level when discharged at said known rate $I_D$; and subtracting $t_1$ from $t_2$ to obtain an indication of the value of $I_x$.

* * * * *

UNITED STATES PATENT OFFICE
CERTIFICATE OF CORRECTION

PATENT NO. : 4,023,160
DATED : May 10, 1977
INVENTOR(S) : Barry Alex Kirschner

It is certified that error appears in the above-identified patent and that said Letters Patent are hereby corrected as shown below:

Column 11, line 7, "first stage" should read --first sense--

Column 12, lines 2 and 3, "third interval" should read --third time interval--.

Signed and Sealed this

Fifteenth Day of November 197

[SEAL]

Attest:

RUTH C. MASON
*Attesting Officer*

LUTRELLE F. PARKER
*Acting Commissioner of Patents and Trademark*